US008669475B2

(12) United States Patent
Ohnuki

(10) Patent No.: US 8,669,475 B2
(45) Date of Patent: Mar. 11, 2014

(54) SUSPENSION SUBSTRATE, SUSPENSION, AND MANUFACTURING METHOD OF SUSPENSION SUBSTRATE

(75) Inventor: Masao Ohnuki, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 140 days.

(21) Appl. No.: 13/219,815

(22) Filed: Aug. 29, 2011

(65) Prior Publication Data

US 2012/0048609 A1 Mar. 1, 2012

(30) Foreign Application Priority Data

Sep. 1, 2010 (JP) ................... 2010-195929

(51) Int. Cl.
*H05K 1/00* (2006.01)
(52) U.S. Cl.
USPC .......... 174/254; 174/255; 174/260; 360/245.9
(58) Field of Classification Search
None
See application file for complete search history.

(56) References Cited

U.S. PATENT DOCUMENTS 6,388,201 B2 * 5/2002 Yamato et al. ............... 174/255
7,924,658 B2 * 4/2011 Shimazawa et al. ........ 369/13.14
8,018,685 B2 * 9/2011 Shimazawa et al. ........ 360/245.3
8,205,323 B2 * 6/2012 Iwama ........................ 29/603.04
8,243,388 B2 * 8/2012 Shimazawa et al. ..... 360/125.74

FOREIGN PATENT DOCUMENTS

| JP | 2008-059645 A | 3/2008 |
| JP | 2008-059695 A | 3/2008 |
| JP | 2008-130165 A | 6/2008 |
| JP | 2008-159159 A | 7/2008 |
| JP | 2009-301597 A | 12/2009 |
| JP | 2010-040112 A | 2/2010 |
| JP | 2010-146655 A | 7/2010 |

OTHER PUBLICATIONS

"Development of Heat-Assisting Mode Recording Head Basic Technique that Makes 5 Times Higher in HDD Capacity than Present Products and Contributes to Decrease in Consumption Power of Data Center", Hitac, the Jun. 2010 issue thereof, Hitachi Ltd., pp. 17-18.

* cited by examiner

*Primary Examiner* — Ishwarbhai B Patel
(74) *Attorney, Agent, or Firm* — Ladas & Parry LLP

(57) ABSTRACT

A main object of the present invention is to provide a suspension substrate capable of supplying electric power easily to an assisting element fitted thereto. The object is attained by providing a suspension substrate comprising a metal supporting substrate, an insulating layer formed on the metal supporting substrate, and a wiring layer formed on the insulating layer, wherein the metal supporting substrate has, in a recording element mounting region for mounting a recording element, an opening for arranging and fitting thereinto a heat assisting element, wherein the wiring layer has a heat assisting wiring layer having a terminal section for supplying electric power directly to the heat assisting element.

5 Claims, 10 Drawing Sheets

FIG. 10
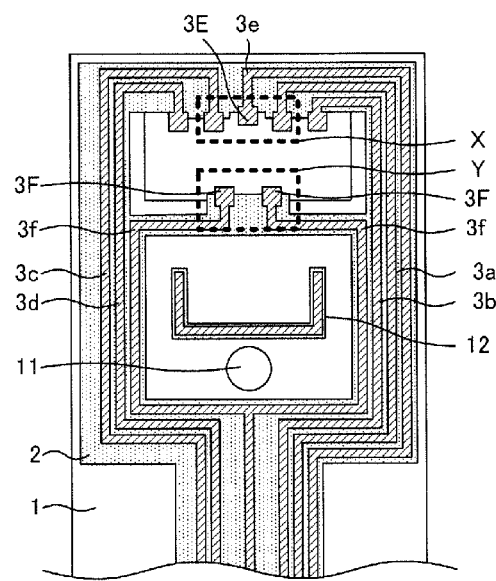
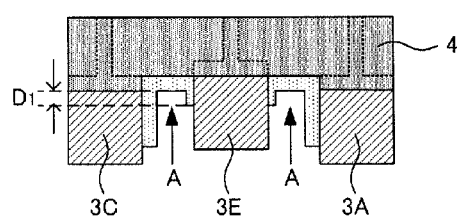
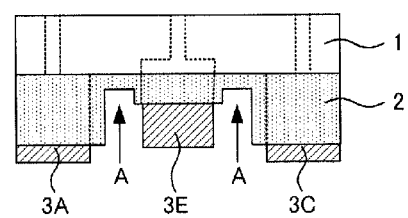
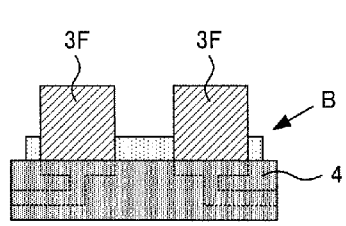
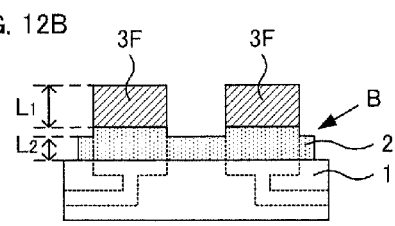

SUSPENSION SUBSTRATE, SUSPENSION, AND MANUFACTURING METHOD OF SUSPENSION SUBSTRATE

TECHNICAL FIELD

The present invention relates to a suspension substrate used in, for example, a hard disk drive (HDD).

BACKGROUND ART

In recent years, the information processing quantity of personal computers and the information processing speed of the personal computers have been required to be increased in light of the spread of the Internet and the like. Following this, it has been becoming necessary that hard disk drives (HDDs) integrated into personal computers are also improved in capacity and information transmission speed.

In order to attain an increase in the capacity of HDDs (i.e., a density growth thereof), it is effective to make the size of magnetic particles small in recording media. However, if the size of the magnetic particles is too small, the magnetization of the individual magnetic particles is thermally unstable. Thus, recorded information is not easily kept over a long term for the following reason: if the size of the magnetic particles becomes small, the anisotropic magnetic energy KuV of each of the particles (Ku represents the anisotropic magnetic energy of the particle per unit volume, and V represents the volume of the magnetic particle) becomes small so that magnetization is oriented at random by thermal fluctuation kT (k represents the Boltzmann constant, and T represents the absolute temperature of the particle), thus, the magnetization is decreased. The limit that this is caused is referred to as the limit of superparamagnetism.

In order to extend the limit of superparamagnetism, it is effective to use magnetic particles large in coercive force. However, when magnetic particles large in coercive force are used, the intensity of a reversing magnetic field necessary for reversing the polarity of the magnetization is large so that information is not easily recorded in a recording medium. To solve this problem, heat assisting recording is known (see, for example, Japanese Patent Application Laid-Open (JP-A) No. 2009-301597, JP-A No. 2010-40112, JP-A No. 2008-159159, JP-A No. 2008-059695, JP-A No. 2008-130165, JP-A No. 2008-059645, and JP-A No. 2010-146655, and "Development of Heat-Assisting Mode Recording Head Basic Technique that Makes 5 Times Higher in HDD Capacity than Present Products and Contributes to Decrease in Consumption Power of Data Center", Hitac, the June (2010) issue thereof, Hitachi Ltd., pp. 17-18). In heat assisting recording, a recording medium is heated just before information is recorded in the recording medium, thereby attaining the recording while the coercive force of the magnetic particles is temporarily lowered. Thus, the assisting recording has an advantage that even when magnetic particles large in coercive force are used, information is easily recorded in a recording medium.

SUMMARY OF INVENTION

Technical Problem

As a heat assisting element, for example, a semiconductor laser diode element is known. As a method for supplying electric power to such a heat assisting element, for example, JP-A No. 2008-059645 discloses, in FIG. 8 thereof, a method of setting, onto a slider 111, lead lines 116 and 117 for supplying LD-driving electric power. However, this method has a problem that in the case of setting the lead line for supplying the electric power onto a surface of the slider, the step of manufacturing the slider becomes complicated.

In light of this problem, the present invention has been made, and a main object of the invention is to provide a suspension substrate making it possible to supply electric power easily to a heat assisting element.

Solution to Problem

In order to solve the problem, the invention provides a suspension substrate comprising a metal supporting substrate, an insulating layer formed on the metal supporting substrate, and a wiring layer formed on the insulating layer, wherein the metal supporting substrate has, in a recording element mounting region for mounting a recording element, an opening for arranging and fitting thereinto a heat assisting element, and wherein the wiring layer has a heat assisting wiring layer having a terminal section for supplying electric power directly to the heat assisting element.

According to the invention, the suspension substrate has the heat assisting wiring layer, which has a terminal section for supplying electric power directly to the heat assisting element, therefore, electric power can easily be supplied to the heat assisting element.

It is preferred in the invention that the terminal section of the heat assisting wiring layer is a terminal section connected to the heat assisting element on an insulating-layer-side surface of the terminal section.

It is preferred in the invention that the plural terminal sections of the heat assisting wiring layer are arranged, and a partition made of the insulating layer is formed between any adjacent two of the terminal sections. When connection (onto the terminal sections) is performed through solder or the like, the generation of a short circuit can be prevented.

It is preferred in the invention that the terminal section of the heat assisting wiring layer is a terminal section connected to the heat assisting element on a surface of the terminal section opposite to an insulating-layer-side surface of the terminal section.

It is preferred in the invention that the terminal section of the heat assisting wiring layer is a terminal section having a structure in which the surface opposite to the insulating-layer-side surface, and the insulating-layer-side surface are exposed. The preferred form makes it easy to bend the terminal section.

The invention also provides a suspension comprising the above-mentioned suspension substrate, and a load beam that is located on a metal-supporting-substrate-side surface of the suspension substrate, and has an opening at a position corresponding to the opening in the suspension substrate.

According to the invention, the above-mentioned suspension substrate is used to make it possible that electric power is easily supplied to the heat assisting element.

The invention also provides a manufacturing method of a suspension substrate, comprising a metal supporting substrate, an insulating layer formed on the metal supporting substrate, and a wiring layer formed on the insulating layer, comprising steps of: a laminated member preparing step of preparing a laminated member having a metal supporting member, an insulating member formed on the metal supporting member, and a conductor member formed on the insulating member; a wiring layer forming step of etching the conductor member to form the wiring layer which has a heat assisting wiring layer having a terminal section for supplying electric power directly to a heat assisting element; a metal supporting substrate forming step of etching the metal supporting member to form the metal supporting substrate having, in a recording element mounting region for mounting a recording element, an opening for arranging and fitting thereinto a heat assisting element; and an insulating layer forming step of etching the insulating member to form the insulating layer.

According to the invention, a suspension substrate capable of supplying electric power directly to the heat assisting element can be yielded by performing the above-mentioned steps.

Advantageous Effects of Invention

The suspension substrate of the invention produces an advantageous effect that electric power can easily be supplied to the heat assisting element.

BRIEF DESCRIPTION OF DRAWINGS

FIG. 10 is a schematic plan view illustrating still another example of the suspension substrate of the invention;

FIGS. 11A and 11B are schematic plan views referred to in order to describe a region X in FIG. 10;

FIGS. 12A and 12B are schematic plan views referred to in order to describe a region Y in FIG. 10;

DESCRIPTION OF EMBODIMENTS

Hereinafter, a detailed description will be made about the suspension substrate of the invention, the suspension thereof, and the process thereof for producing a suspension substrate.

A. Suspension Substrate

The suspension substrate of the invention comprises a metal supporting substrate, an insulating layer formed on the metal supporting substrate, and a wiring layer formed on the insulating layer, wherein the metal supporting substrate has, in a recording element mounting region for mounting a recording element, an opening for arranging and fitting thereinto a heat assisting element, and wherein the wiring layer has a heat assisting wiring layer having a terminal section for supplying electric power directly to the heat assisting element.

Figure 1A:
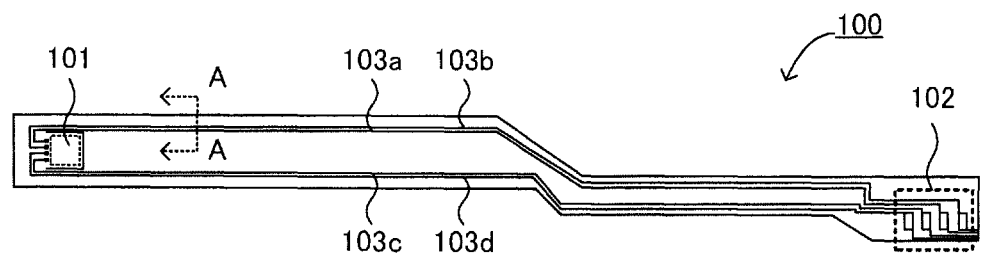
FIGS. 1A and 1B are schematic views illustrating an example of an ordinary suspension substrate.
Figure 1B:
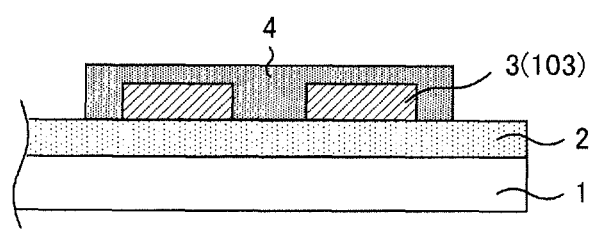

FIGS. 1A and 1B are schematic views illustrating an example of an ordinary suspension substrate. FIG. 1A is a schematic plan view of the suspension substrate, and FIG. 1B is a sectional view thereof taken on line A-A in FIG. 1A. In FIG. 1A, the illustration of its cover layer is omitted for the sake of convenience. The suspension substrate 100 illustrated in FIG. 1A comprises a recording element mounting region 101 formed at one of both tips of the substrate, an external circuit substrate connecting region 102 formed at the other tip, and wiring layers 103a to 103d for connecting the recording element mounting region 101 and the external circuit substrate connecting region 102 electrically to each other. The wiring layers 103a and 103b are paired wiring layers. In the same manner, the wiring layers 103c and 103d are paired wiring layers. One layer of the two pairs is a writing wiring layer, and other layer is a reading wiring layer. As illustrated in FIG. 1B, the suspension substrate comprises a metal supporting substrate 1, an insulating layer 2 formed on the metal supporting substrate 1, a wiring layer 3 formed on the insulating layer 2, and a cover layer 4 covering the wiring layer 3.

Figure 2:
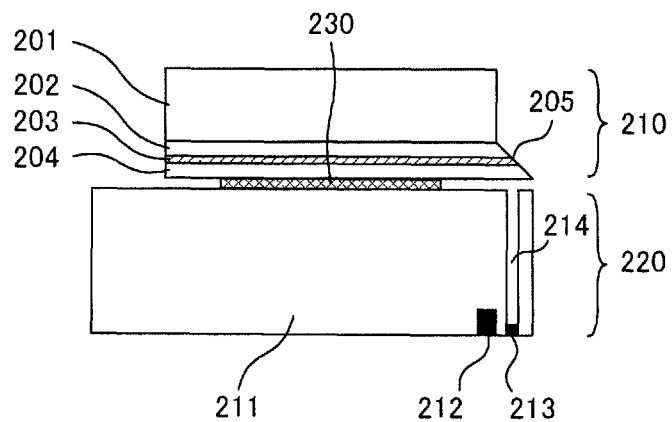
FIG. 2 is a schematic sectional view illustrating an example of an ordinary heat assisting element and a recording element.

FIG. 2 is a schematic sectional view illustrating an example of an ordinary heat assisting element and a recording element. The heat assisting element 210 in FIG. 2 has a semiconductor substrate 201, a first clad layer 202, an active layer 203, a second clad layer 204, and a reflecting mirror 205. The recording element 220 (recording body) in FIG. 2 has a slider 211, a magnetic field generating element 212, and a near-field light generating element 213, and an optical waveguide 214. The heat assisting element 210 and the recording element 220 are jointed to each other through an adhesive layer 230. Light output from the active layer 203 is reflected on the reflecting mirror 205, passed through the optical waveguide 214, and then brought into the near-field light generating element 213. This form makes it possible that the recording medium is heated just before the magnetic field generating element 212 attains recording, so as to lower temporarily the coercive force of the magnetic particles.

Figure 3A:
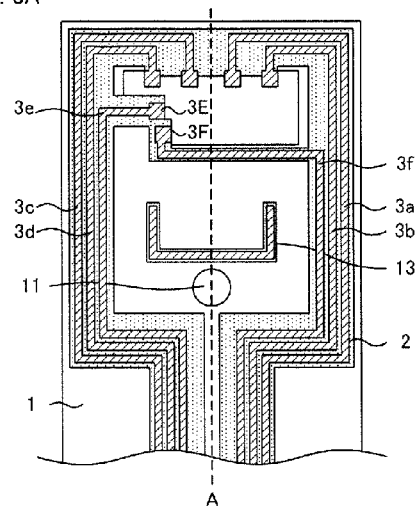
FIGS. 3A to 3D are schematic plan views referred to in order to describe an example of the suspension substrate of the invention.
Figure 3B:
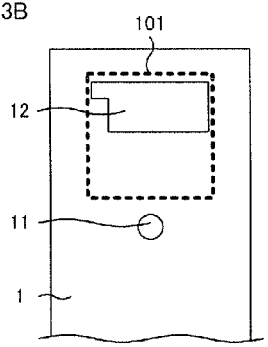
Figure 3C:
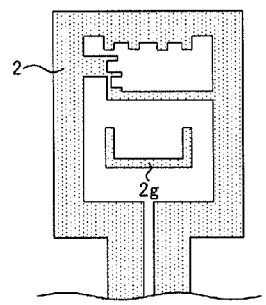
Figure 3D:
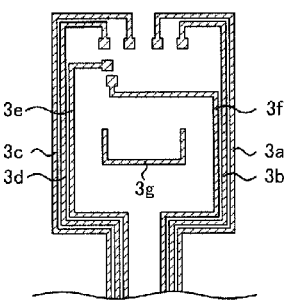

FIGS. 3A to 3D are schematic plan views describing an example of the suspension substrate of the invention. In FIG. 3A, the illustration of its cover layer is omitted for the sake of convenience. FIGS. 3B, 3C and 3D are schematic plan views of a metal supporting substrate, an insulating layer, and a wiring layer that constitute the suspension substrate in FIG. 3A, respectively. As illustrated in FIG. 3A, the suspension substrate of the invention has wiring layers 3a and 3b for reading, wiring layers 3c and 3d for writing, and heat assisting wiring layers 3e and 3f having terminal sections 3E and 3F, respectively, for supplying electric power directly to a heat assisting element (not illustrated). For example, the terminal sections 3E and 3F are terminal sections that are to be connected to the n and p poles of a semiconductor laser diode element, respectively. As described above, one of both terminal sections of each of the heat assisting wiring layers 3e and 3f is arranged near an opening 12 so that electric power can be supplied to the heat assisting element. The other terminal section of each of the heat assisting wiring layers 3e and 3f is arranged, for example, in an external circuit substrate connecting region of a tail area of the suspension substrate in the same manner as in the case of the reading wiring layers and the writing wiring layers.

As illustrated in FIG. 3B, the suspension substrate of the invention has, in the recording element mounting region 101 of the metal supporting substrate 1, an opening 12 for arranging and fitting thereinto the heat assisting element. In the invention, the wording "recording element mounting region" means a region of any suspension substrate that is consistent, in planar view, with a recording element to be mounted. In the invention, the position of the opening 12 needs only to be a position where the opening 12 overlaps with at least one portion of the recording element mounting region 101 in planar view. Furthermore, as illustrated in FIGS. 3A and 3B, the reading wiring layers 3a and 3b are formed substantially symmetrically to the writing wiring layers 3c and 3d with respect to a central line A of the recording element mounting region X. By the arrangement, a recording element is horizontally kept with ease. Similarly, it is preferred to form the heat assisting wiring layer 3e substantially symmetrically to the heat assisting wiring layer 3f with respect to the central line A of the recording element mounting region except the vicinity of the opening 12.

Figure 4:
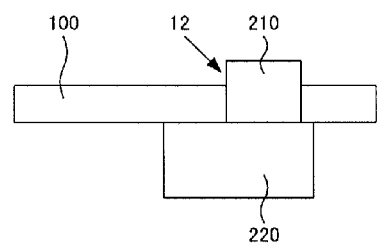
FIG. 4 is another schematic sectional view referred to in order to describe the example of the suspension substrate of the invention.

As illustrated in FIG. 4, it is preferred that the suspension substrate 100 has, on the surface thereof, the mounted recording element 220. Furthermore, it is preferred that the heat assisting element 210 is arranged to be fitted into the opening 12, whereby the heat assisting element 210 is mounted on the recording element 220 made exposed from the opening 12. Between the suspension substrate 100 and the recording element 220, an adhesive layer may be formed, as well as between the heat assisting element 210 and the recording element 220.

The suspension substrate of the invention has a heat assisting wiring layer having a terminal section for supplying electric power directly to a heat assisting element, therefore, according to the invention, electric power can easily be supplied to the heat assisting element. Moreover, when a slider or some other member is mounted onto the suspension substrate of the invention, it is unnecessary to set any lead lines for electric-power-supply onto a surface of the slider or the member, therefore, a slider or some other member that is obtained by a conventional production process can be used as it is. Furthermore, the structure of the slider or the like can be simplified so that an increase in costs can be restrained.

When a lead line for electric-power-supply is set onto a surface of a slider or the like in the prior art, a poor contact may be caused at both of a contact point between the electric-power-supply lead line and the heat assisting element, and a contact point between the electric-power-supply lead line and the suspension substrate. Against this, the invention has an advantage that a poor contact is not easily caused since no contact point is present between the suspension substrate and its electric-power-supply lead line (heat assisting wiring layer) although a contact point is present between the electric-power-supply lead line and the suspension substrate.

FIG. 2 in JP-A No. 2008-059695 discloses a structure in which electrodes 47 and 48 of a laser diode 40 are electrically connected to electrode pads 247 and 248 of a flexure 201, respectively, through reflow solder, although the connecting manner in this structure is not ordinary. However, in the structure disclosed in JP-A No. 2008-059695, the flexure 201 has no opening. For this reason, the structure is largely affected by heat generated from the laser diode 40, so that a bad effect is produced onto the floating performance of the slider 22. Against this, the metal supporting substrate in the invention has an opening, thus, heat from the heat assisting element can be effectively radiated. The structure disclosed in JP-A No. 2008-059695 is a structure wherein the flexure 201, a light source 23, and the slider 22 are laminated in this order. Generally, about a slider, a single side thereof is obliquely cut, and the flow of air is sent to a groove in the bottom surface of the slider by effect of the inclination. By the resultant negative pressure, force directed downward is generated to stabilize the floating quantity and keep the precision of the positioning. However, in the structure disclosed in JP-A No. 2008-059695, a light source unit is arranged between the flexure and the slider, thus, the light source unit functions as a barrier when the air flow is sent to the slider bottom surface. As a result, there is caused a problem that the floating quantity is not easily controlled. Against this, the metal supporting substrate in the invention can be arranged in such a manner that a heat assisting element is fitted into the opening therein. Thus, a recording element can be arranged onto the suspension substrate by no aid of the heat assisting element. As a result, the present invention has an advantage that the floating quantity is easily controlled.

Although the metal supporting substrate in the invention has the opening, a recording element can be held on the whole of the surface of the suspension substrate (see FIG. 4). Therefore, as compared with a connecting manner as illustrated in FIG. 14 in JP-A No. 2008-059645, the connecting manner according to the invention makes it possible to make larger the contact area between the suspension substrate and the recording element, so that the reliability of the connection therebetween can be made sufficiently higher. As a result, the floating attitude of the recording element is easily controlled. Generally, in order to approximate a reading-out section of a recording element to a disk surface, it is necessary that a recording element mounting region of the suspension substrate has a sufficient flexibility. However, when the contact area between the suspension substrate and the recording element is small, the flexibility is damaged so that the floating attitude of the recording element is not easily controlled.

Hereinafter, the suspension substrate of the invention will be described in the state that the description is divided into sections about members of the suspension substrate, and about the structure of the suspension substrate.

1. Members of the Suspension Substrate

Firstly, the members of the suspension substrate of the invention are described herein. The suspension substrate of the invention has a metal supporting substrate, an insulating layer, and a wiring layer.

The metal supporting substrate in the invention functions as a support of the suspension substrate. The material of the metal supporting substrate is preferably a metal having a spring property. Specifically, the material is, for example, SUS. The thickness of the metal supporting substrate, which is varied in accordance with the species of the material, ranges, for example, from 10 to 20 µm.

The insulating layer in the invention is a layer formed on the metal supporting substrate. The material of the insulating layer is not particularly limited as far as the material has insulating properties. The material is, for example, a resin. Examples of the resin include polyimide resin, polybenzoxazol resin, polybenzimidazole resin, acrylic resin, polyethernitrile resin, polyethersulfone resin, polyethylene terephthalate resin, polyethylene naphthalate resin, and polyvinyl chloride. Of these resins, polyimide resin is preferred since the resin is excellent in insulating properties, heat resistance, and chemical resistance. The material of the insulating layer may be a photosensitive material or a non-photosensitive material. The thickness of the insulating layer ranges, for example, preferably from 5 to 30 µm, more preferably from 5 to 18 µm, and even more preferably from 5 to 12 µm.

The wiring layer in the invention is formed on the insulating layer. The material of the wiring layer is not particularly limited as far as the material has electroconductivity. The material is, for example, a metal, and is preferably copper (Cu). The material of the wiring layer may be rolled copper or electrolyte copper. The thickness of the wiring layer ranges, for example, preferably from 5 to 18 µm, and more preferably from 9 to 12 µm. In a partial area of the surface of the wiring layer, a wiring plating section may be formed thereon. By forming the wiring plating section, deteriorations (such as corrosion) of the wiring layer can be prevented. In the invention, it is particularly preferred that the wiring plating section is formed at any terminal section for connecting the suspension substrate to an element or an external circuit substrate. The plating of the wiring plating section is not particularly limited in kind. Examples of the plating include Au plating, Ni plating, Ag plating and Cu plating. It is particularly preferred in the invention that Ni plating and Au plating are formed from the surface side of the wiring layer toward the outside. The thickness of the wiring plating section ranges, for example, from 0.1 to 4 µm.

The wiring layer in the invention includes at least a heat assisting wiring layer having a terminal section for supplying electric power directly onto a heat assisting element. Furthermore, the wiring layer usually includes a writing wiring layer, and a reading wiring layer. The wiring layer may optionally include a noise-shielding wiring layer, a crosstalk-preventing wiring layer, a wiring layer for a power source, a wiring layer for grounding, a wiring layer for flight height control, a wiring layer for sensors, a wiring layer for actuators, and/or some other wiring layer.

The suspension substrate of the invention may have a cover layer formed to cover the wiring layer. The formation of the cover layer makes it possible to prevent deteriorations (such as corrosion) of the wiring layer. Examples of the material of the cover layer include the resins described as the material of the above-mentioned insulating layer. Polyimide resin is particularly preferred. The material of the cover layer may be a photosensitive material, or a non-photosensitive material. The thickness of the cover layer ranges, for example, preferably from 2 to 30 µm, and more preferably from 2 to 10 µm.

2. Structure of the Suspension Substrate

Secondly, the structure of the suspension substrate of the invention is described herein. The suspension substrate of the invention has a characteristic that its metal supporting substrate has, in a recording element mounting region for mounting a recording element, an opening for arranging and fitting thereinto a heat assisting element. The "recording element mounting region" is as described above. As far as the opening is an opening for arranging and fitting thereinto a heat assisting element, the opening may be an opening separated completely from the outer peripheral surface of the metal supporting substrate (for example, the opening shown in FIG. 3B), or may be an opening whose part has a cut-out portion connected to the outer peripheral surface of the metal supporting substrate. The shape of the opening is not particularly limited as far as the shape permits a heat assisting element to be arranged to be fitted into the opening. Examples of the shape of the opening include a rectangle, a trapezoid, a polygon, and circle.

The suspension substrate of the invention is preferably a substrate having a surface on which a recording element is to be mounted. The suspension substrate of the invention is more preferably a substrate that has the cover layer covering the wiring layer, and can have a recording element mounted on the cover layer since the substrate makes it easy to keep the flatness of the recording element. As illustrated in FIGS. 3A to 3D, it is particularly preferred in the suspension substrate of the invention that the recording element mounting region 101 has a pillow region 13 having an insulating layer 2g, a wiring layer 3g, and the cover layer (not illustrated). The substrate makes it easier to keep the flatness of the recording element.

The following describes a method for connecting the suspension substrate of the invention to a heat assisting element. In the invention, the terminal section of the heat assisting wiring layer and the terminal section of the heat assisting element are electrically connected directly to each other. The terminal section of the heat assisting wiring layer may be a section for attaining the connection on the insulating-layer-side surface (of the section), or may be a section for attaining the connection on the (section) surface at the side opposite to the insulating layer.

Figure 5:
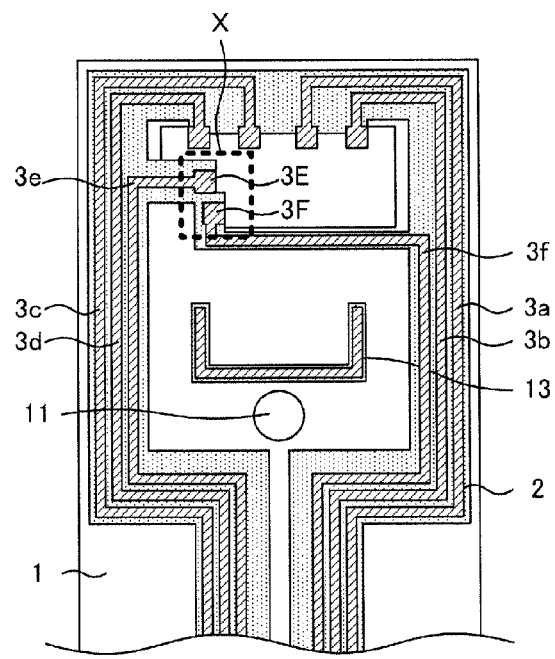
FIG. 5 is yet another schematic pattern view illustrating an example of the suspension substrate of the invention.
Figure 6A:
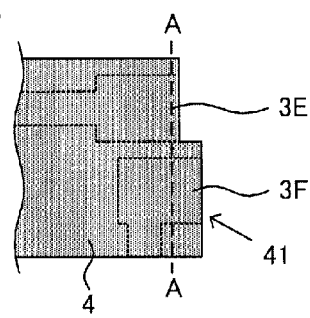
FIGS. 6A to 6C are schematic views referred to in order to describe a region X in FIG. 5.
Figure 6B:
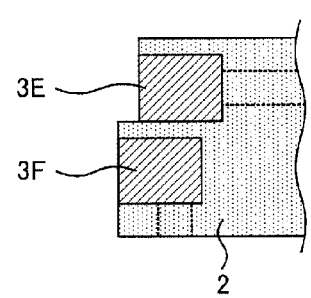
Figure 6C:
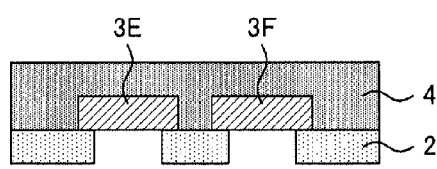
Figure 7A:
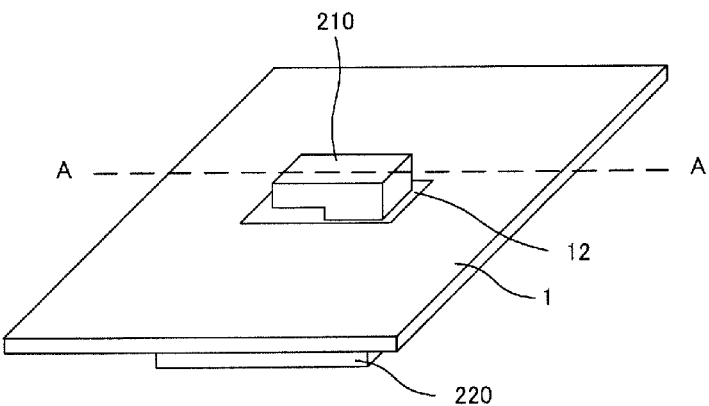
FIGS. 7A and 7B are schematic views referred to in order to explain the suspension substrate of the invention.
Figure 7B:
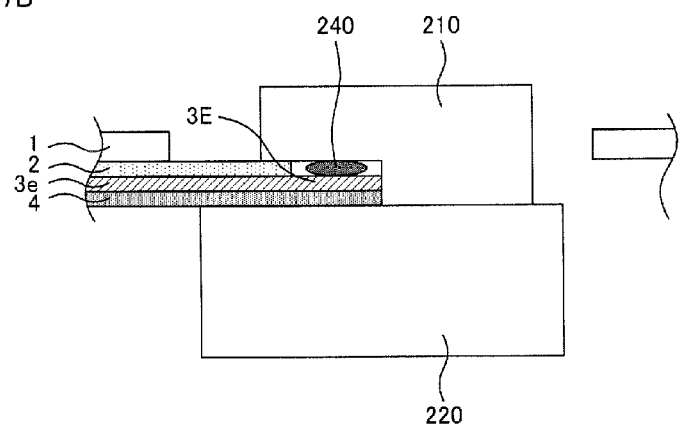

Firstly, with reference to FIGS. 5 to 7, a description is made about a case of connecting the terminal section of the heat assisting wiring layer to a heat assisting element on the insulating-layer-side surface of the section. FIG. 5 is a schematic plan view illustrating an example of the suspension substrate of the invention. In FIG. 5, the illustration of its cover layer is omitted for the sake of convenience. FIG. 6A is an enlarged view of a region X in FIG. 5, and FIG. 6B is a schematic plan view obtained by observing the region in FIG. 6A from the insulating layer side thereof. FIG. 6O is a sectional view of the region taken on line A-A in FIG. 6A. FIG. 7A is a perspective view showing a positional relationship between a metal supporting substrate of this example, and a heat assisting element and a recording element for this example, and FIG. 7B is a sectional view taken on line A-A in FIG. 7A.

The suspension substrate illustrated in FIG. 5 has heat assisting wiring layers 3e and 3f having terminal sections 3E and 3F, respectively. The terminal sections 3E and 3F are covered with a cover layer 4 (FIG. 6A), and are connected to the heat assisting element at the surfaces at the side of an insulating layer 2 of the sections (FIG. 6B). The wiring plating sections as described above are formed on exposed surfaces of the terminal sections 3E and 35, respectively, which are exposed at the insulating layer 2 side of the suspension substrate. As illustrated in FIG. 7A, the heat assisting element 210 is arranged to be fitted into an opening 12 in the metal supporting substrate 1. It is preferred that the heat assisting element 210 is partially small in thickness in order to be connected to a heat assisting wiring layer of the substrate. As illustrated in FIG. 7B, the heat assisting element 210 is electrically connected to the terminal section 3E through an electroconductive connecting section 240 made of solder or the like.

As has been illustrated in FIGS. 5 to 7, when the terminal section of the heat assisting wiring layer is connected to a heat assisting element at the insulating-layer-side surface of the section, the following advantage is produced: the connection of the heat assisting element at the insulating-layer-side surface of the terminal section makes it possible to transmit force directed downward, which is based on an air-used negative pressure from the bottom surface of the slider, directly onto the flexible flexure (suspension substrate) so that the floating attitude of the recording element is easily controlled. In the case of mounting a heat assisting element besides a recording element onto a suspension substrate, the resultant is larger in weight than in the case of mounting only the recording element by the weight of the heat assisting element. This matter increases the burden of a voice coil motor for positioning the recording coil, and the dual stage actuator (micro- or milliactuator). Thus, a high-speed positioning would be hindered. Moreover, at the time when an impact is applied to the HDD, or some other time, a disturbance against the positioning is increased. When the disturbance is severe, the suspension cannot maintain a very small flowing quantity to cause easily a problem (crash) that the recording element unfavorably contacts the disk. It is therefore important to make a further control of the floating attitude of the suspension. In the suspension structure, wherein a heat assisting element is connected, on the insulating-layer-side surface of the terminal section, to the section, produced is an advantage that it is easy to set a heat sink for supporting the radiation of heat from the heat assisting element.

In a connecting manner as illustrated in FIG. 2 in JP-A No. 2008-059695, force directed downward by negative pressure cannot be transmitted to the flexure (suspension substrate) unless the force is made large. As a result, it is difficult to control the floating attitude. Additionally, there is caused a problem that the contact area of the slider cannot be sufficiently kept against shrinkage of semiconductor laser elements.

Figure 8A:
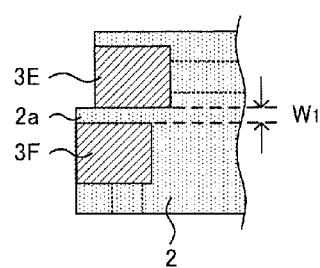
FIGS. 8A to 8C are each a schematic plan view illustrating a terminal section in the invention.

In the invention, it is preferred that plural terminal sections are set in the heat assisting wiring layer, and a partition made of the insulating layer is formed between any adjacent two of the terminal sections. This form makes it possible to prevent the generation of a short circuit when the connection of the terminal sections is attained through solder or the like. When the terminal sections of the heat assisting wiring layer are connected to a heat assisting element, in particular, on the insulating-layer-side surfaces of the sections, the perceptibility of the connection moieties is deteriorated. In light of this matter, by setting the partition, the generation of a short circuit can be prevented with a higher certainty. Specifically, as illustrated in FIG. 8A, it is preferred that a partition 2a made of an insulating layer 2 is formed between terminal sections 3E and 3F. The width $W_1$ of the partition 2a, which is not particularly limited, ranges, for example, preferably from 10 to 200 μm, and more preferably from 15 to 40 μm.

Figure 8B:
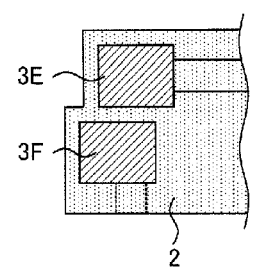
Figure 8C:
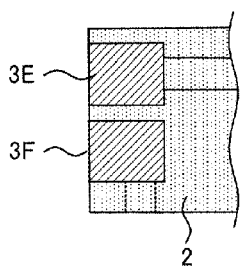

In order to prevent the generation of a short circuit, it is allowable that as illustrated in FIG. 8A, the insulating layer 2 surrounds each of the terminal sections 3E and 3F to be arranged in a U-shaped form around the section, or that as illustrated in FIG. 8B, an insulating layer 2 surrounds the entire circuit of each of terminal sections 3E and 3F. In each of FIGS. 8A and 8B, the positions of ends of the terminal section 3E are deviated from that of ends of the terminal section 3F. This form makes it possible to prevent the generation of a short circuit more effectively. However, if the generation of a short circuit can be sufficiently restrained by the formation of the partition, it is permissible that as illustrated in FIG. 8C, the position of ends of a terminal section 3E are consistent with that of ends of a terminal section 3F. By deviating the position of the ends of the terminal section 3E from that of the ends of the terminal section 3F as has been illustrated in FIGS. 8A and 8B, the size of the terminal sections does not need to be made small even in the case of using, for example, a heat assisting element small in distance between its p and n poles. As a result, the reliability of the connection can be maintained at a high level.

As illustrated in FIGS. 6A and 6B, it is preferred in the invention that an end 41 of the cover layer 4 does not project from the position of ends of the terminal sections 3E and 3F. If the position of the ends 41 of the cover layer 4 projects therefrom, a connection failure may be caused when the terminals are connected through solder or the like.

Figure 9:
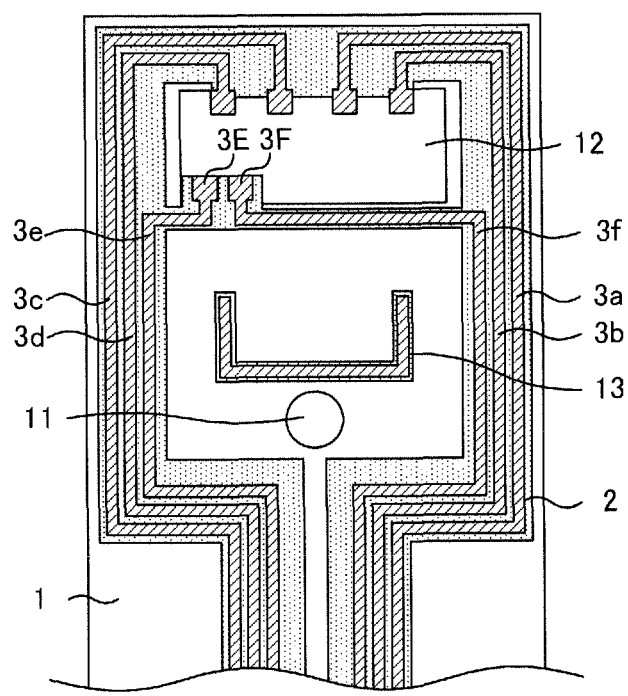
FIG. 9 is a schematic plan view illustrating still another example of the suspension substrate of the invention.

Another embodiment of the suspension substrate illustrated in FIG. 5 is illustrated in, for example, FIG. 9. In this case, terminal sections 3E and 3F are arranged across an inner long side of a rectangular opening 12 in the present suspension substrate.

Secondly, with reference to FIGS. 10 to 13, a description is made about a case where the terminal section of the heat assisting wiring layer is connected to a heat assisting element on the surface of the section opposite to the insulating-layer-side surface. FIG. 10 is a schematic plan view illustrating an example of the suspension substrate of the invention. In FIG. 10, the illustration of its cover layer is omitted for the sake of convenience. FIG. 11A is an enlarged view of a region X in FIG. 10, and FIG. 11B is a schematic plan view obtained by observing the region in FIG. 11A from the insulating layer side thereof. FIG. 12A is an enlarged view of a region Y in FIG. 10, and FIG. 12B is a schematic plan view obtained by observing the region in FIG. 12A from the insulating layer side thereof. FIG. 13A is a perspective view showing a positional relationship between a metal supporting substrate of this example, and a heat assisting element and a recording element for this example, and FIG. 13B is a sectional view taken on line A-A in FIG. 13A.

The suspension substrate illustrated in FIG. 10 has heat assisting wiring layers 3e and 3f having terminal sections 3E and 3F, respectively. For example, the terminal section 3E is a terminal section that is to be connected to a gate electrode of a semiconductor laser diode element, and the terminal sections 3F are terminal sections that are each to be connected to the n pole or p pole of the semiconductor laser diode element. In the case of using, as the semiconductor laser diode element, an npn type or pnp type laser transistor, terminal sections therefor are usually formed as illustrated in FIG. 10. In this case, the heat assisting wiring layer 3f is branched in the middle so that the terminal sections 3F are equal to each other in electric potential. In the case of using a laser transistor, it is possible to control the turning-on or turning-off of the laser, control the potential of the n pole or p pole, or the intensity of the laser.

Figure 13A:
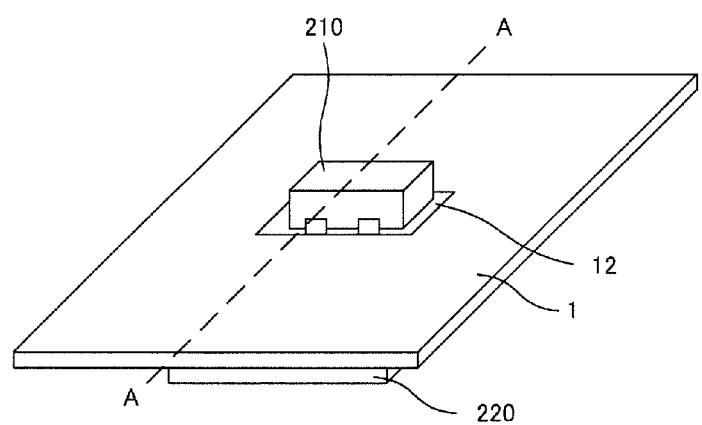
FIGS. 13A and 13B are schematic views referred to in order to describe the suspension substrate of the invention.
Figure 13B:
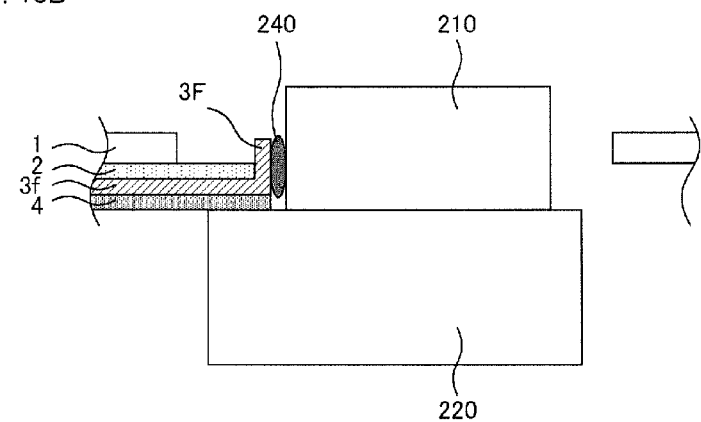

In FIG. 10, the terminal sections 3E and 3F are connected to the heat assisting element on the (section) surfaces opposite to the insulating-layer-side surfaces thereof (FIG. 11A, and FIG. 12A). It is preferred that wiring plating sections as described above are formed on exposed surfaces of the terminal sections 3E and 3F. In this case, about the terminal sections, at least their surfaces opposite to their insulating-layer-side surfaces need only to be exposed. As illustrated in FIG. 11B or 12B, the terminal sections 3E and 3F are preferably terminal sections having a structure in which their insulating-layer-side-2-surfaces are also exposed. This structure makes it easy to bend or fold the terminal sections. As illustrated in FIG. 12B, when the length of the terminal sections in each of which both the surfaces thereof are exposed is represented by $L_1$, the length $L_1$ ranges, for example, preferably from 30 to 200 μm, and more preferably from 40 to 130 μm. As illustrated in FIG. 13A, the heat assisting element, which is an element 210, is arranged to be fitted into an opening 12 in the metal supporting substrate 1. As illustrated in FIG. 13B, the heat assisting element 210 is electrically connected to the terminal sections 3F bent toward the insulating layer 2 through an electroconductive connecting section 240 made of solder or the like.

When terminal sections of the heat assisting wiring layer in the invention are bent to be connected to a heat assisting element as has been illustrated in FIG. 13B, the following advantages are produced: the area where the heat assisting element can be made/kept large relatively to the recording element, so that the positional relationship between the recording element and the heat assisting element can easily be controlled. In general, unless the position of a heat assisting element to be arranged onto a recording element is matched precisely with that of an optical waveguide formed near (or by) the magnetic poles (i.e., an optical waveguide in the slider), the following is declined: the light coupling efficiency of an optical waveguide between a light source and the slider, and the optical waveguide in the slider, or the light coupling efficiency of the light source and the optical waveguide in the slider. As a result, the intensity of the light introduced in the optical waveguide in the slider is lowered. Thus, there is caused a problem that the rising temperature of the disk is lowered. Therefore, it is important in the invention to control the positional relationship between the recording element and the heat assisting element. Moreover, the area where the heat assisting element can be arranged relatively to the recording element can be kept large, thus, even when the size of the heat assisting element is made large with an output-increase, the heat assisting element can easily be arranged. Moreover, when the wiring layer is bent, the area where the heat assisting element can be arranged becomes larger than when the wiring layer is not bent, thus, even when the size of the heat assisting element is made large, produced is an advantage that the size of the opening does not need to be varied. When the wiring layer is not bent, a connecting structure therefor is unavoidably formed on the bottom surface of the heat assisting element so that the area where the heat assisting element can be arranged unfavorably becomes small. The bending of the wiring layer also produces an advantage that in the heat assisting element which is an element having a side surface where a connecting structure is to be arranged, the connection can be attained without laying any lead line onto the element.

In the invention, it is preferred that the insulating layer has a concave between the terminal section of the heat assisting wiring layer and a different terminal section. This form makes it possible to prevent force generated when the terminal section of the heat assisting wiring layer is bent from being transmitted to the different terminal section. Specifically, as illustrated in FIGS. 11A and 11B, it is preferred that the insulating layer 2 has concaves A between the terminal section 3E and different terminal sections 3A and 3C. The different terminal sections may each be another terminal section of the heat assisting wiring layer or a terminal section of any (optional) wiring layer of other than the heat assisting wiring layer. The depth $D_1$ of the concaves A is not particularly limited, and ranges, for example, preferably from 10 to 50 µm, and more preferably from 15 to 30 µm.

In the invention, it is preferred that the insulating layer positioned below the terminal section of the heat assisting wiring layer projects from the metal supporting substrate. This form makes it possible to improve the flexibility of the terminal section, and relieve an effect based on, for example, the out-of-position of the terminal section of the heat assisting element. Specifically, as illustrated in FIG. 12B, it is preferred that the insulating layer 2 positioned beneath the terminal sections 3F projects from the metal supporting substrate 1 so that projecting sections B are formed. When the distance between an edge (top edge) of the insulating layer 2 and the corresponding edge of the metal supporting substrate 1 is represented by $L_2$ as illustrated in FIG. 12B, the distance $L_2$ ranges, for example, preferably from 30 to 200 µm, and more preferably from 40 to 130 µm. As illustrated in FIG. 12A, it is preferred from the viewpoint of an improvement of the flexibility of the suspension substrate that the insulating layer 2 beneath the terminal sections 3F projects from the cover layer 4.

Figure 14A:
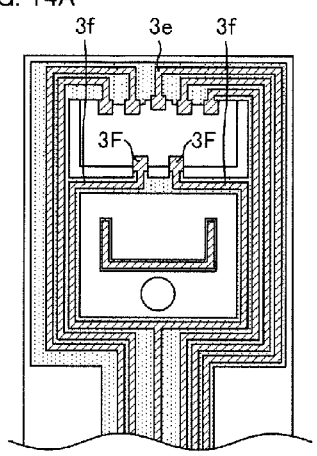
FIGS. 14A to 14C are each a schematic plan view illustrating yet another example of the suspension substrate of the invention.
Figure 14B:
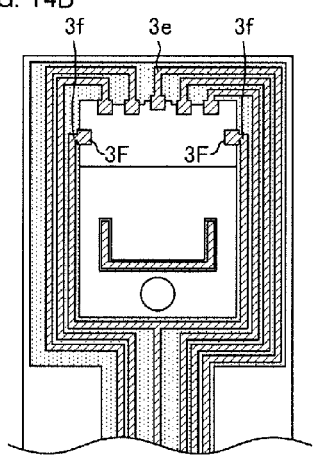
Figure 14C:
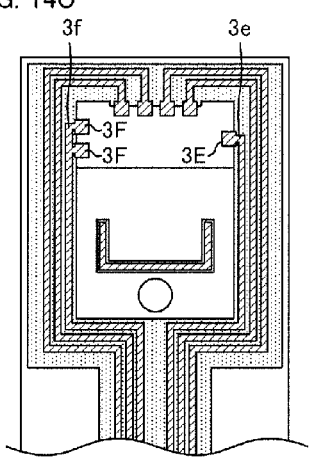

Examples of a different embodiment of the suspension substrate that has been illustrated in FIG. 10 include embodiments illustrated in FIG. 14A to 14C. In FIG. 14A, terminal sections 3F are arranged across an inner long side of a rectangular opening in the present suspension substrate. In FIG. 14B, terminal sections 3F are arranged across respective short sides of a rectangular opening. In FIG. 14C, a terminal sections 3E and 3F are arranged across respective short sides of a rectangular opening.

The following describes the heat assisting element and the recording element for the invention. This heat assisting element is not particularly limited as far as the element can assist the recording of the recording element thermally. The heat assisting element is preferably an element using light since this element can attain heat assisting recording in a light dominant recording mode. The heat assisting element using light is, for example, a semiconductor laser diode element. The semiconductor laser diode element may be a pn type element, or may be a pnp type or npn type element. The heat assisting element using light may optionally have a reflecting lens, a condensing light and/or some other for introducing output light rays to optical waveguides set in the slider or the like. The semiconductor laser diode element may be a plane emission laser or an end face emission laser.

In the meantime, the recording element (recording body) for the invention is not particularly limited as far as the element is a recording element exhibiting a recording property improved by the effect of the heat assisting element. For example, the recording element is preferably an element having a slider and a magnetism generating element. As has been illustrated in FIG. 2, it is more preferred that the recording element has a magnetism generating element, a slider, an optical waveguide and a near-field light generating element.

B. Suspension

The following describes the suspension of the invention. The suspension of the invention has the above-mentioned suspension substrate, and a load beam that is fitted to the metal-supporting-substrate-side surface of the suspension substrate and has an opening at a position corresponding to the opening in the suspension substrate.

Figure 15A:
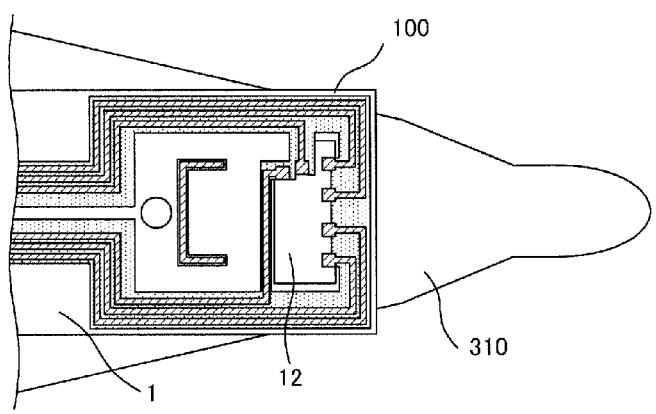
FIGS. 15A to 15C are schematic views illustrating an example of the suspension of the invention.
Figure 15B:
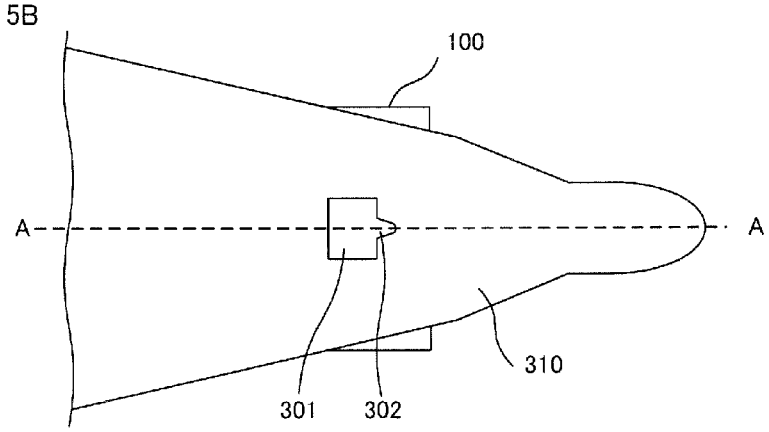
Figure 15C:
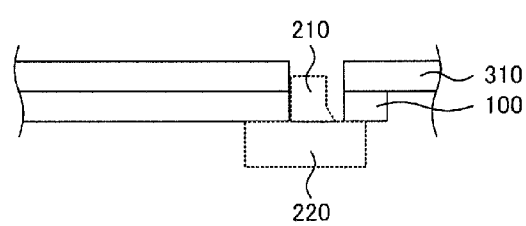

FIG. 15 is a schematic view illustrating an example of the suspension of the invention. FIG. 15A is a schematic plan view of this example, and FIG. 15B is a schematic plan view obtained by observing the suspension in the FIG. 15A from the load beam side thereof. FIG. 15C is a sectional view taken on line A-A in FIG. 15B. As illustrated in FIGS. 15A and 15B, the suspension of the invention has the above-mentioned suspension substrate 100 and a load beam 310 that is fitted to the surface of the metal-supporting-substrate 1-side of the suspension substrate 100 and has an opening 301 at a position corresponding to an opening 12 in the suspension substrate 100. As illustrated in FIG. 15C, in the example of the invention, a recording element 220 is mounted onto a surface of the suspension substrate 100, and a heat assisting element 210 is arranged to be fitted into the openings in the suspension substrate 100 and the load beam 310.

According to the invention, the use of the above-mentioned suspension substrate makes it possible to supply electric power to the heat assisting element easily. Furthermore, the metal supporting substrate of the suspension substrate and the load beam each have the opening, so that heat from the heat assisting element can be effectively radiated.

The suspension substrate in the invention is equivalent in contents to that described in the item "A. Suspension substrate". Thus, description thereof is not repeated here. The load beam in the invention is not particularly limited as far as the beam is a load beam having an opening at a position corresponding to the opening in the suspension substrate. The wording "position corresponding to the opening in the suspension substrate" denotes a position where the opening in the load beam overlaps with at least one portion of the opening in the suspension substrate in planar view. About the opening in the load beam, it is preferred that the heat assisting element can be arranged to be fitted into the opening.

Figure 16A:
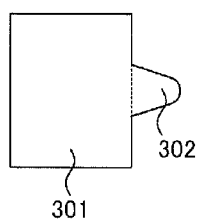
FIGS. 16A to 16C are each a schematic plan view referred to in order to describe an opening of a load beam.
Figure 16B:
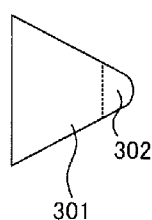
Figure 16C:
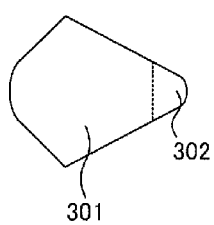

As illustrated in FIG. 15B, in the load beam in the invention, the opening 301 may have a concave 302. When the heat assisting element 210 has the reflecting mirror 205 as has been illustrated in FIG. 2, this preferred form makes it possible to check easily whether or not the reflecting mirror 205 is arranged at an appropriate position. Additionally, when the opening 301 has the concave 302, the accumulation of heat into the reflecting mirror 205 can be effectively restrained. The shape of the opening in the load beam (from this shape, the shape of the concave is excluded) is not particularly limited, and may be, for example, a rectangle (in FIG. 16A), a trapezoid (in FIG. 16B), any shape composed of one or more straight lines and/or curves (in FIG. 16C), a polygon (not illustrated), or a circle (not illustrated).

C. Manufacturing Method of a Suspension Substrate

The following describes a manufacturing method of a suspension substrate of the invention. The manufacturing method of a suspension substrate of the invention comprises a metal supporting substrate, an insulating layer formed on the metal supporting substrate, and a wiring layer formed on the insulating layer, comprising steps of: a laminated member preparing step of preparing a laminated member having a metal supporting member, an insulating member formed on the metal supporting member, and a conductor member formed on the insulating member; a wiring layer forming step of etching the conductor member to form the wiring layer which has a heat assisting wiring layer having a terminal section for supplying electric power directly to a heat assisting element; a metal supporting substrate forming step of etching the metal supporting member to form the metal supporting substrate having, in a recording element mounting region for mounting a recording element, an opening for arranging and fitting thereinto a heat assisting element; and an insulating layer forming step of etching the insulating member to form the insulating layer.

Figure 17A:
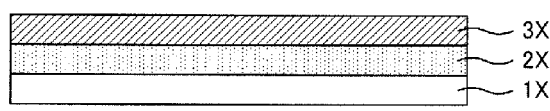
FIGS. 17A to 17E are schematic sectional views illustrating an example of the manufacturing method of a suspension substrate of the invention.
Figure 17B:
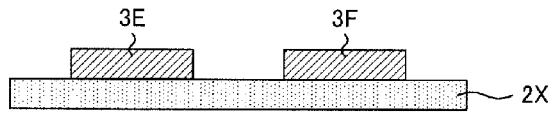

FIGS. 17A to 17E are schematic sectional views illustrating an example of the manufacturing method of a suspension substrate of the invention. FIGS. 17A to 17E are each a view corresponding to the section taken on the line A-A in FIG. 6A in the same way as FIG. 6C. In FIGS. 17A to 17E, prepared is first a laminated member having a metal supporting member 1X, an insulating member 2X formed on the metal supporting member 1X, and a conductor member 3X formed on the insulating member 2X (FIG. 17A). Next, a dry film resist (DFR) is used to form a predetermined resist pattern on the surfaces of the conductor member 3X and the metal supporting member 1X. The conductor member 3X and the metal supporting member 1X exposed from the resist pattern are wet-etched to form a heat assisting wiring layer having terminal sections 3E and 3F, and an opening (FIG. 17B). In FIG. 17B, the metal supporting member 1X is removed by the formation of the opening.

Figure 17C:
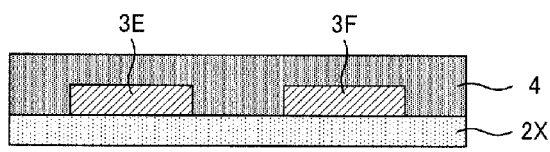
Figure 17D:
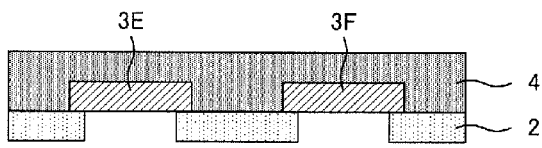

Thereafter, a cover layer 4 is formed to cover the terminal sections 3E and 3F (FIG. 17C). Next, a predetermined resist pattern is formed on the insulting member 2X, and then the insulating member 2X exposed from the resist pattern is wet-etched to form an insulating layer 2 (FIG. 17D). Next, wiring plating sections 5 are formed on the terminal sections 3E and 3F exposed from the insulating layer 2 (FIG. 17D). In this way, a suspension substrate can be yielded. In FIGS. 17A to 17E, a suspension substrate as has been illustrated in FIG. 5 can be yielded, however, in the case of yielding a suspension substrate as has been illustrated in FIG. 10, for example, a method for forming its cover layer needs only to be appropriately changed.

According to the invention, a suspension substrate capable of supplying electric power directly to the heat assisting element can be yielded by conducting the individual steps.

Hereinafter, about the manufacturing method of a suspension substrate of the invention, the individual steps of the method are described in turn.

1. Laminated Member Preparing Step

The laminated member preparing, step in the invention is a step of preparing a laminated member having a metal supporting member, an insulating member formed on the metal supporting member, and a conductor member formed on the insulating member. The laminated member in the invention may be a commercially available laminated member, or a laminate produced by forming an insulating member and a conductor member onto a metal supporting member.

2. Wiring Layer Forming Step

The wiring layer forming step in the invention is a step of etching the conductor member, thereby forming the wiring layer which has a heat assisting wiring layer having a terminal section for supplying electric power directly to a heat assisting element.

The method for forming the wiring layer is, for example, a method of forming a resist pattern on the conductor member of the laminated member, and wet-etching the conductor member exposed from the resist pattern. The kind of an etching solution used in the wet etching is preferably selected appropriately in accordance with the kind of the conductor member. When the material of the conductor member is, for example, copper, the etching solution may be, for example, an iron chloride based etching solution.

3. Metal Supporting Substrate Forming Step

The metal supporting substrate forming step in the invention is a step of etching the metal supporting member to form the metal supporting substrate having, in a recording element mounting region for mounting a recording element, an opening for arranging and fitting thereinto a heat assisting element.

The method for forming the metal supporting substrate is, for example, a method of forming a resist pattern onto the metal supporting member of the laminated member, and wet-etching the metal supporting member exposed from the resist pattern. The kind of an etching solution used in the wet etching is preferably selected appropriately in accordance with the kind of the metal supporting member. When the material of the metal supporting member is, for example, SUS, the etching solution may be, for example, an iron chloride based etching solution. It is also preferred to perform the present step simultaneously with the above-mentioned wiring layer forming step.

4. Insulating Layer Forming Step

The insulating layer forming step is a step of etching the insulating member, thereby forming the insulating layer.

The method for forming the insulating layer is, for example, wet etching. The kind of an etching solution used in the wet etching is preferably selected appropriately in accordance with the kind of the insulating layer. When the material of the insulating layer is, for example, a polyimide resin, the etching solution may be, for example, an alkali based etching solution.

5. Other Steps

The manufacturing method of a suspension substrate of the invention may have, besides the above-mentioned steps, a cover layer forming step of forming a cover layer for covering the wiring layer. The method for forming the cover layer is not particularly limited, and is preferably selected appropriately in accordance with the material of the cover layer. When the material of the cover layer is a photosensitive material, the cover layer can be formed into a pattern form by forming the cover layer on the entire surface of the workpiece, exposing the layer to light and then developing the light-exposed layer. When the material of the cover layer is a non-photosensitive material, the cover layer can be formed into a pattern form by forming the cover layer on the entire surface, forming a predetermined resist pattern on the surface of the cover layer, and then removing regions of the cover layer that are exposed from the resist pattern by wet etching.

The manufacturing method of a suspension substrate of the invention may have a wiring plating section forming step of forming a wiring plating section onto a partial area of the wiring layer. The method for forming the wiring plating section may be electroplating, or electroless plating, and is preferably electroless plating. The manufacturing method of a suspension substrate of the invention may have a via section forming step of forming a via section that penetrates through the insulating layer to connect the wiring layer and the metal supporting substrate electrically to each other. The method for forming the via section is, for example, a plating method (such as electroplating, or electroless plating). Furthermore, the manufacturing method of a suspension substrate of the invention may have an external shape working step of working the external shape of the metal supporting substrate.

The invention is not limited to the above-mentioned embodiments. The embodiments are mere examples. The technical scope of the invention includes embodiments that have substantially the same structure and produce substantially the same advantageous effects as any embodiment in which the technical conception recited in the claims of the invention is embodied.

EXAMPLE

Hereinafter, the invention will be more specifically described by way of using examples.

Example

An insulating layer forming material made of a non-photosensitive polyimide was used to form an insulating member having a thickness of 10 μm on a metal supporting member having a thickness of 20 μm and made of SUS304 by a coating method. Furthermore, Ni—Cr—Cu was deposited into a seed layer having a thickness of about 300 nm onto the insulating member by sputtering. The resultant was used as an electroconductive medium to perform Cu plating, thereby forming a conductor member that was a Cu plating layer having a thickness of 9 μm. In this way, a laminated member was yielded (FIG. 17A).

Next, in such a manner that a jig hole important in positional precision could be made in the SUS side of the laminated member, and a target wiring layer could be made on the Cu-plating layer side thereof, a dry film was used to pattern the sides simultaneously. In this way, patterned resists were yielded. Thereafter, a ferric chloride solution was used to etch the workpiece. After the etching, the resists were peeled off to yield a wiring layer that has a heat assisting wiring layer, and a metal supporting substrate having an opening (FIG. 17B).

Next, the upper of the wiring layer and the insulating member was coated with a non-photosensitive polyimide based cover-layer-forming material in a liquid form by means of a die coater. The workpiece was dried, and subsequently a resist pattern was formed thereon. The workpiece was developed at the same time of etching the cover layer forming material. Thereafter, the etched cover-layer-forming material was hardened to yield a cover layer (FIG. 17C). Next, a resist pattern was formed onto the insulating member, and then an organic alkali etching solution was used to etch the workpiece. After the etching, the resist was peeled off to yield an insulating layer (FIG. 17D).

Figure 17E:
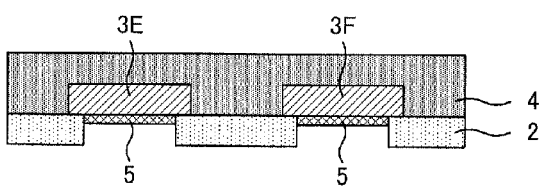

Next, terminal sections of the heat assisting wiring layer were washed with an acid, and then the workpiece was subjected to Au electroplating by a jig plating method, so as to form wiring plating sections (FIG. 17E). Next, in order to attain electric conduction between the metal supporting substrate and the wiring layer, a resist pattern was formed onto the workpiece, the resultant was subjected to Ni electroplating and then the resist was peeled off to make vias. The used Ni electroplating bath was a standard Ni sulfamate plating bath. The Ni electroplating was performed by immersion electroplating (at 0.2 A for 14 minutes). Lastly, in order to work the external shape of the SUS, a resist pattern was formed on the workpiece, only the SUS side of the resultant was etched and then the resist was peeled off to yield a suspension substrate.

Reference Signs List

1 Metal supporting substrate
2 Insulating layer
3 Wiring layer
3e, 3f Heat assisting wiring layer
3E, 3F Terminal section
4 Cover layer
5 Wiring plating section
11 Jig hole
12 Opening
13 Pillow region
100 Suspension substrate
101 Recording element mounting region
102 External circuit substrate connecting region
103 Wiring layer
210 Heat assisting element
220 Recording element
230 Adhesive layer
240 Electroconductive connecting section
301 Opening
302 Concave
310 Load beam

The invention claimed is:

1. A suspension substrate, comprising a metal supporting substrate, an insulating layer formed on the metal supporting substrate, and a wiring layer, formed on the insulating layer,
    wherein the metal supporting substate has, in a recording element mounting region for mounting a recording element, an opening for arranging and fitting thereinto a heat assisting element, and
    wherein the wiring layer has a heat assisting wiring layer having a terminal section for supplying electric power directly to the heat assisting element, and
    wherein the terminal section of the heat assisting wiring layer is a terminal section connected to the heat assisting element on an insulating-layer-side surface of the terminal section and is formed in the opening of the metal supporting substrate and the insulating layer.

2. The suspension substrate according to claim 1, wherein a plurality of the terminal sections of the heat assisting wiring layer are arranged, and a partition made of the insulating layer is formed between any adjacent two of the terminal sections.

3. The suspension substrate according to claim 1, wherein the terminal section of the heat assisting wiring layer is a terminal section connected to the heat assisting element on a surface of the terminal section opposite to an insulating-layer-side surface of the terminal section.

4. The suspension substrate according to claim 3, wherein the terminal section of the heat assisting wiring layer is a terminal section having a structure in which the surface opposite to the insulating-layer-side surface, and the insulating-layer-side surface are exposed.

5. A suspension, comprising: the suspension substrate according to claim 1, and
    a load beam that is located on a metal-supporting-substrate-side surface of the suspension substrate, and has an opening at a position corresponding to the opening in the suspension substrate.

* * * * *